(12) United States Patent  (10) Patent No.: US 8,193,620 B2
Alberghini et al.  (45) Date of Patent: Jun. 5, 2012

(54) INTEGRATED CIRCUIT PACKAGE WITH ENLARGED DIE PADDLE

(75) Inventors: John Alberghini, Burlington, MA (US); Oliver Kierse, Killaloe (IE)

(73) Assignee: Analog Devices, Inc., Norwood, MA (US)

( * ) Notice: Subject to any disclaimer, the term of this patent is extended or adjusted under 35 U.S.C. 154(b) by 292 days.

(21) Appl. No.: 12/707,245

(22) Filed: Feb. 17, 2010

(65) Prior Publication Data

US 2011/0198741 A1 Aug. 18, 2011

(51) Int. Cl.
 *H01L 23/495* (2006.01)
(52) U.S. Cl. ......... 257/675; 257/E21.506; 257/E23.031; 438/106; 438/107; 438/121; 438/122; 438/123
(58) Field of Classification Search .......... 438/106–123; 257/675, E21.506, E23.031
See application file for complete search history.

(56) References Cited

U.S. PATENT DOCUMENTS

| | | | |
|---|---|---|---|
| 5,250,839 A | 10/1993 | Katoh et al. | 257/666 |
| 5,391,439 A | 2/1995 | Tomita et al. | 428/571 |
| 5,683,943 A | 11/1997 | Yamada | 437/220 |
| 6,008,068 A | 12/1999 | Yamada | 438/111 |
| 6,034,422 A | 3/2000 | Horita et al. | 257/677 |
| 6,309,916 B1 * | 10/2001 | Crowley et al. | 438/127 |
| 6,337,510 B1 * | 1/2002 | Chun-Jen et al. | 257/666 |
| 6,876,066 B2 * | 4/2005 | Fee et al. | 257/666 |
| 7,307,347 B2 | 12/2007 | Yagi | 257/773 |
| 7,381,593 B2 | 6/2008 | Ararao et al. | 438/123 |
| 7,394,150 B2 | 7/2008 | Kasem et al. | 257/690 |
| 7,405,468 B2 * | 7/2008 | Masuda et al. | 257/676 |
| 7,459,771 B2 * | 12/2008 | Casati et al. | 257/676 |
| 7,495,321 B2 * | 2/2009 | Do et al. | 257/666 |
| 7,838,974 B2 * | 11/2010 | Poddar et al. | 257/676 |
| 7,911,040 B2 * | 3/2011 | Tay et al. | 257/670 |
| 7,944,062 B2 * | 5/2011 | Groenhuis et al. | 257/787 |
| 2001/0000631 A1 * | 5/2001 | Zandman et al. | 257/738 |
| 2001/0023118 A1 * | 9/2001 | MacPherson et al. | 438/584 |
| 2004/0063240 A1 * | 4/2004 | Madrid et al. | 438/106 |
| 2006/0055063 A1 * | 3/2006 | Boulin et al. | 257/787 |
| 2006/0151861 A1 * | 7/2006 | Noquil et al. | 257/676 |
| 2006/0237826 A1 * | 10/2006 | Boulin et al. | 257/666 |
| 2006/0255479 A1 * | 11/2006 | Kummerl et al. | 257/787 |
| 2007/0090524 A1 * | 4/2007 | Abbott | 257/731 |
| 2007/0132091 A1 * | 6/2007 | Wu et al. | 257/706 |
| 2007/0178628 A1 * | 8/2007 | Lim | 438/113 |
| 2008/0135991 A1 * | 6/2008 | Hamden et al. | 257/666 |
| 2008/0157298 A1 * | 7/2008 | Zhang et al. | 257/669 |
| 2008/0185695 A1 * | 8/2008 | Kim et al. | 257/670 |
| 2008/0293190 A1 * | 11/2008 | Inao et al. | 438/123 |
| 2009/0072362 A1 * | 3/2009 | Wu et al. | 257/675 |
| 2009/0152691 A1 * | 6/2009 | Nguyen et al. | 257/667 |
| 2009/0261461 A1 * | 10/2009 | Sapp et al. | 257/666 |
| 2010/0019362 A1 * | 1/2010 | Galera et al. | 257/676 |
| 2010/0068851 A1 * | 3/2010 | Jeung et al. | 438/109 |
| 2010/0124802 A1 * | 5/2010 | Chiang et al. | 438/124 |
| 2011/0062568 A1 * | 3/2011 | Galera et al. | 257/676 |

* cited by examiner

*Primary Examiner* — Fernando L Toledo
*Assistant Examiner* — Ankush Singal
(74) *Attorney, Agent, or Firm* — Sunstein Kann Murphy & Timbers LLP

(57) ABSTRACT

An integrated circuit package system having a body with a top surface, a bottom surface, and a plurality of side surfaces has a leadframe and encapsulating material that encapsulates at least a portion of the leadframe. The leadframe and encapsulating material are part of the body. The leadframe has a die paddle for supporting a die, and a plurality of leads spaced from the die paddle. The encapsulating material thus also separates the die paddle from the plurality of leads. At least a first portion of the die paddle is exposed to the top surface, while at least a second portion of the die paddle is exposed to the bottom surface.

15 Claims, 4 Drawing Sheets

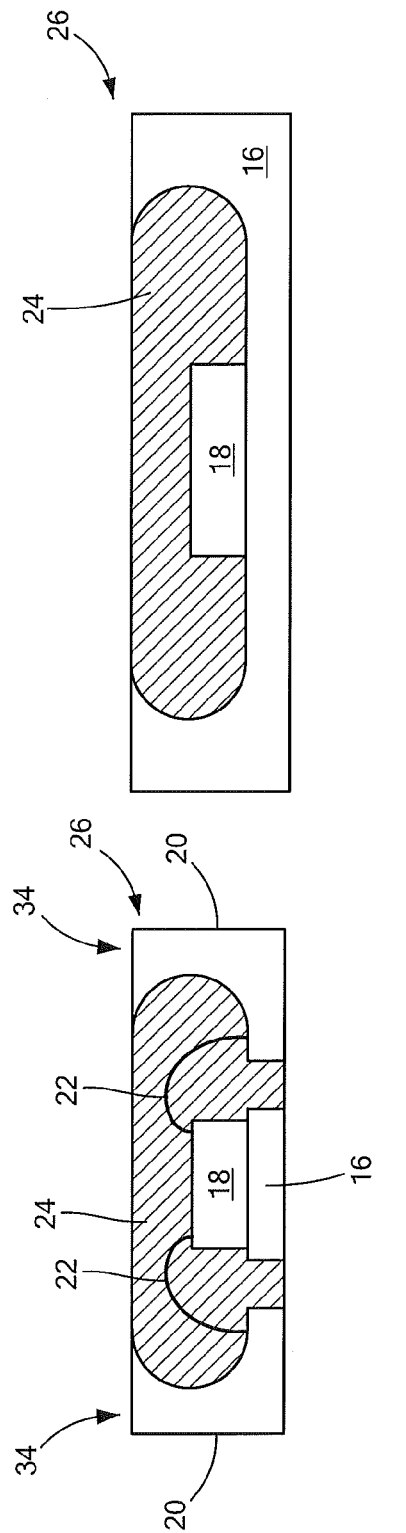
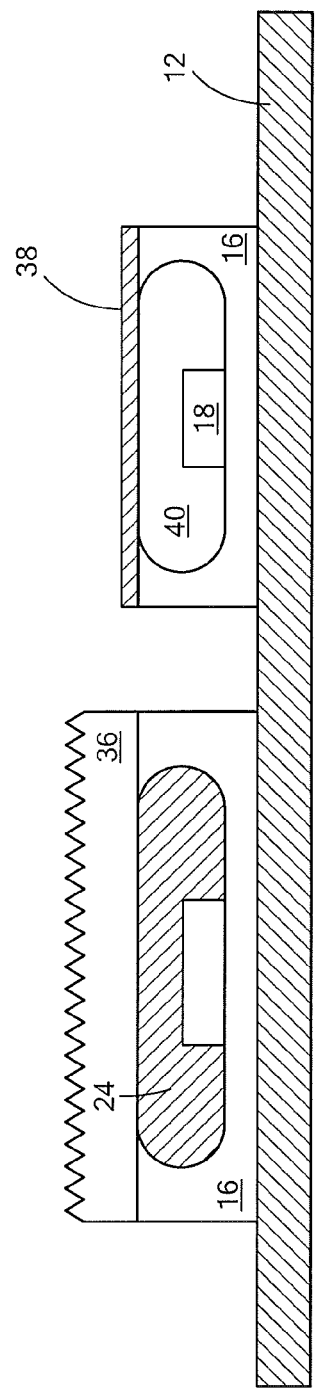
FIG. 4B
FIG. 4A
FIG. 5

INTEGRATED CIRCUIT PACKAGE WITH ENLARGED DIE PADDLE

FIELD OF THE INVENTION

The invention generally relates to integrated circuits and, more particularly, the invention relates to integrated circuit packages.

BACKGROUND OF THE INVENTION

Integrated circuit chips typically are mounted within an integrated circuit package. Among other functions, integrated circuit packages can both protect the chips from the environment and facilitate mounting to an underlying system, such as a printed circuit board or other integrated circuit.

Those in the art have developed many different types of packages for a wide variety of applications. One of the more commonly used types of packages is known as a "leadframe" package. Specifically, a leadframe package often has a metallic leadframe (e.g., formed from copper) for electrically connecting the chip to the external environment, and an encapsulant, such as injection molding material, encapsulating much of the leadframe. Very often, the encapsulant and leadframe form a generally rectangularly shaped body for readily securing to an underlying system.

The leadframe often has two primary parts; namely, a die paddle for supporting the integrated circuit chip/die, and a plurality of leads for electrically connecting the die with the underlying system. To those ends, a die attach material often physically secures the die to the die paddle, while a wire bond or other interconnect electrically connects the die to the leads.

Modern electronics are constantly driving down the size of electronic components, including integrated circuit chips. This favorably enables use of smaller packages, thus minimizing real estate requirements on printed circuit boards. At the same time, the functionality of integrated circuits continues to increase, consequently generating more current and heat. Smaller packages, however, often are not as efficient at removing heat, which, if not properly dissipated, can damage the integrated circuit chip and its underlying system.

Those in the art thus often respond to this problem by securing these smaller chips in larger packages. Undesirably, this directly counteracts the drive toward reducing component size.

SUMMARY OF THE INVENTION

In accordance with one embodiment of the invention, an integrated circuit package system having a body with a top surface, a bottom surface, and a plurality of side surfaces has a leadframe and encapsulating material that encapsulates at least a portion of the leadframe. The leadframe and encapsulating material are part of the body. The leadframe has a die paddle for supporting a die, and a plurality of leads spaced from the die paddle. The encapsulating material thus also separates the die paddle from the plurality of leads. At least a first portion of the die paddle is exposed to the top surface, while at least a second portion of the die paddle is exposed to the bottom surface.

The first portion and second portion may be contiguous and together have a thickness equal to about the package thickness. In that case, the first and second portions together may extend between the bottom surface and the top surface. Moreover, the die paddle may extend to at least two of the side surfaces, and/or the plurality of leads each may extend between the top surface and the bottom surface.

Some embodiments arrange the plurality of leads in an array generally parallel with two of the surfaces to form a dual package configuration. The die paddle also may support and be in thermal contact with a heat sink along the top surface of the system.

To facilitate mounting to an underlying device or circuit board, the leads and mold material may form a plurality of surface mount pads on the bottom surface. The system also may have a die secured to the die paddle, and a plurality of connectors (e.g., wirebonds) electrically connecting the die to at least some of the plurality of leads. In that and other instances, the system also may have a printed circuit board, where the die paddle and leads are surface mounted to the printed circuit board.

Different types of leadframe packages can implement various embodiments. For example, the leadframe and encapsulating material may form a premolded leadframe package having a chamber for receiving a die. Such a system thus also may have a lid generally closing the chamber. Illustrative embodiments also apply to post-molded (a/k/a transfer molded) leadframe packages.

In accordance with another embodiment of the invention, an integrated circuit package has a top surface, a bottom surface, and a plurality of side surfaces. The package also has a leadframe with a die paddle for supporting a die, and a plurality of leads spaced from the die paddle. Encapsulating material encapsulates at least a portion of the leadframe and a portion of the plurality of leads. The encapsulating material (and leads) form a plurality of surface mount pads on the bottom surface, while exposing at least a portion of the die paddle to both the top and bottom surfaces.

In accordance with other embodiments, a packaging method etches a conductive sheet having a top surface and a bottom surface to form a leadframe. The leadframe has a die paddle and a plurality of leads separated from the die paddle. The die paddle is formed from a portion of the top surface and a portion of the bottom surface of the conductive sheet to form respective top and bottom die paddle surfaces. The method then encapsulates at least a portion of the die paddle and at least a portion of the plurality of leads with an encapsulating material to form a generally rectangular body having top and a bottom surfaces. The top surface of the body includes the top die paddle surface, while the bottom surface of the body includes the bottom die paddle surface.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

FIG. 4A schematically shows a cross-sectional view of the microchip shown in FIG. 2 along line A-A of FIG. 3B.

FIG. 4B schematically shows a cross-sectional view of the microchip shown in FIG. 2 along line B-B of FIG. 3B.

FIG. 5 schematically shows a cross-sectional view of two microchips packaged within leadframe packages on a printed circuit board in accordance with various embodiments of the invention.

DESCRIPTION OF ILLUSTRATIVE EMBODIMENTS

In illustrative embodiments, the leadframe of a leadframe package is configured to enhance heat dissipation and facilitate removal of the package from a printed circuit board (if necessary). To that end, the leadframe has a die paddle with an enlarged mass that extends between the top and bottom surfaces of the package. This enlarged mass effectively acts like a built-in heat sink within the package. In a corresponding manner, the leadframe has leads that also may extend between the top and bottom surfaces. Details of illustrative embodiments are discussed below.

Figure 1:
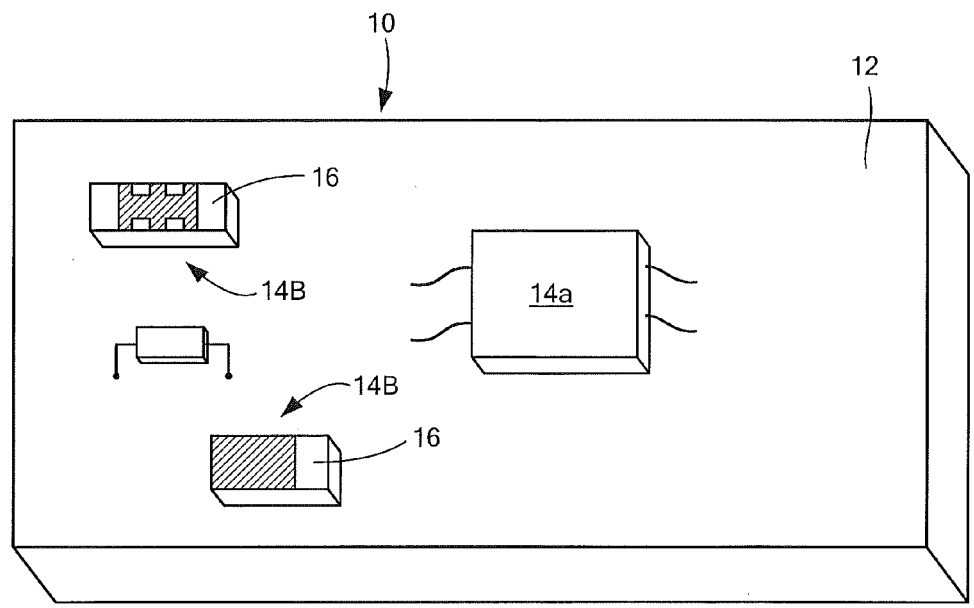
FIG. 1 schematically shows a system using a packaged microchip configured in accordance with illustrative embodiments of the invention.

FIG. 1 schematically shows a system 10 using leadframe packages configured in accordance with illustrative embodiments of the invention. Specifically, the system 10 includes a plurality of circuit components mounted on a conventional printed circuit board 12. One of the components is a conventional leaded leadframe package 14a. Accordingly, the leaded package 14a has a plurality of leads, extending from its side, that are soldered to the circuit board 12. This is in contrast to the two leadless packages 14b also mounted to the circuit board 12. More particularly, the leadless packages 14b each have internal leads that form pads 34 (not shown) surface mounted to the circuit board 12. Accordingly, because they have no leads extending from their sides, the leadless packages 14b favorably do not require the extra lateral space required by the leaded package, such as package 14a.

Figure 2:
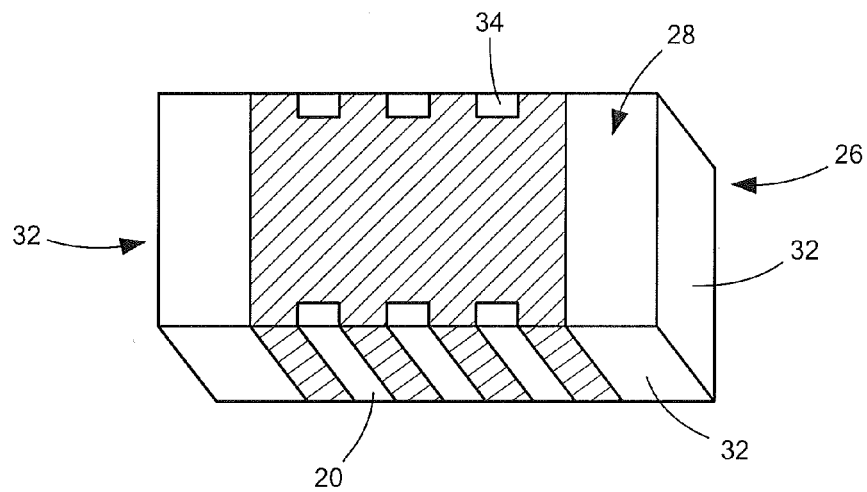
FIG. 2 schematically shows a perspective view of a packaged microchip configured in accordance with illustrative embodiments of the invention.
Figure 3A:
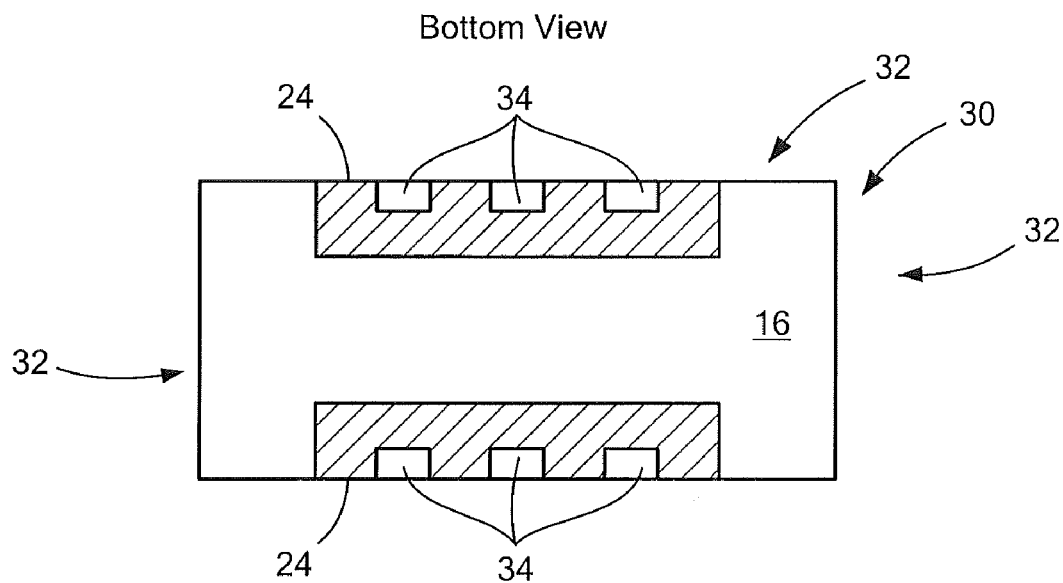
FIG. 3A schematically shows a bottom view on the microchip shown in FIG. 2.
Figure 3B:
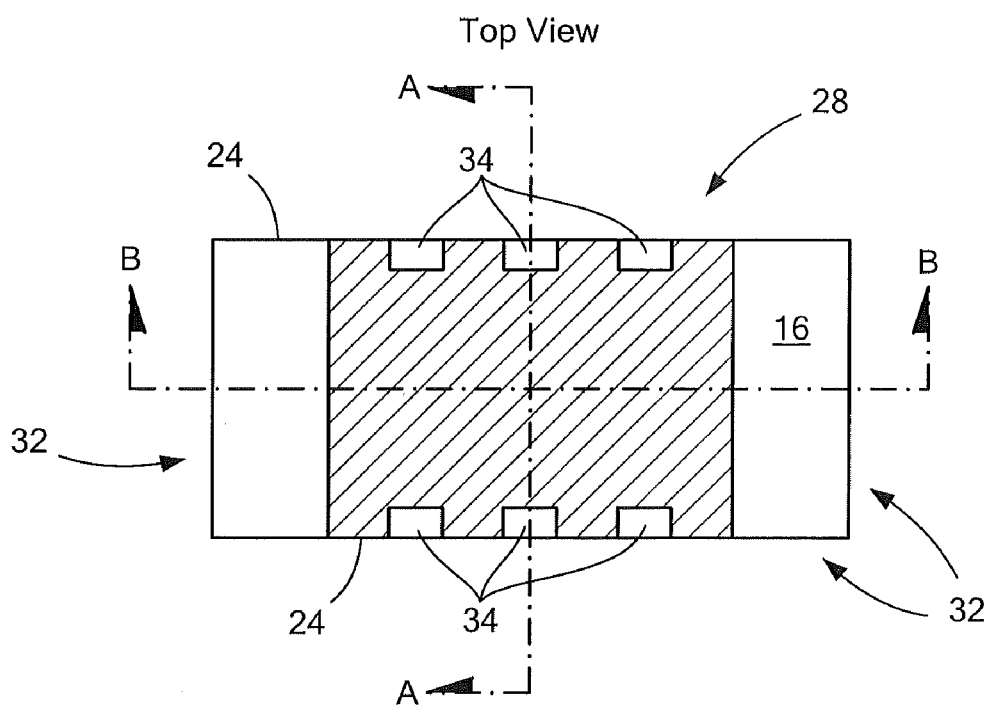
FIG. 3B schematically shows a top view of the microchip shown in FIG. 2.

As discussed in greater detail below, the two leadless packages 14b each have a die paddle 16 extending between their respective top and bottom surfaces. To that end, FIG. 2 schematically shows exterior details of a leadframe package implementing illustrative embodiments of the invention. This package and variants are generally identified in the subsequent figures by reference number 14. FIGS. 3A and 3B respectively show additional details in their respective bottom and top views of the same leadframe package 14. Moreover, FIGS. 4A and 4B schematically show further details in two cross-sectional views of the same package 14.

Specifically, as shown in those drawings, the package 14 has a die paddle 16 supporting a die 18 (FIGS. 4A and 4B), and a plurality of internal leads 20 electrically connected to the die 18 by means of a plurality of wirebonds 22. The die 18 may be a conventional integrated circuit or chip adaptable for use in a leadframe package. For example, among other things, the die 18 may implement the functionality of an application-specific integrated circuit, analog to digital converter, microprocessor, or amplifier. In fact, the die 18 also may implement microelectromechanical system (MEMS) functionality, such as an inertial sensor (e.g., accelerometers are gyroscopes). Applications packaging MEMS devices may use premolded leadframe packages (e.g., see FIG. 5, discussed below) rather than postmolded leadframe packages, which are shown in FIGS. 2-4B. It nevertheless should be noted that a MEMS chip also may use a postmolded leadframe package. For example, the MEMS chip may have a cap that protects its internal microstructure. It should be noted that other, non-MEMS chips also may use a premolded package.

Encapsulating material 24, such as conventional thermoplastic molding material, encapsulates the die 18 and leadframe to form a generally rectangular body 26 with a top surface 28 (FIG. 3B), a bottom surface 30 (FIG. 3A), and four side surfaces 32. In addition to encapsulating the die 18, the encapsulating material 24 encapsulates the leads 20 to form a plurality of exposed interface pads 34 on the top and/or bottom surfaces 28 and 30. Alternatively, the encapsulating material 24 may encapsulate the leads 20 without exposing the pads 34 to both surfaces 28 and 30 (i.e., only exposing to one surface 28 or 30). Note that the pads 34 on the top surface 28 also may be referred to herein as leads 20 (they are formed from leads of the leadframe even though they do not extend from the body 26)

The encapsulating material 24 also encapsulates a portion of the die paddle 16. Prior art die paddles known to the inventors often are exposed to the bottom surface 30 only. Specifically, their principal function is simply to support the die 18. As such, die paddles typically are soldered to their underlying system (e.g., the circuit board 12), as are the leads 20.

After experimentation, however, the inventors learned that the die paddle conducts/dissipates a substantial majority of the heat generated by the die 18. This is especially acute as more high functionality dies 18, such as those made with gallium arsenide, become more widely used. Accordingly, that discovery led the inventors to discover that an appropriately configured enlarged die paddle vastly improves heat dissipation—it acts like a built-in heat sink.

To that end, the inventors determined that extending the die paddle between the top and bottom surfaces 28 and 30 should enhance heat dissipation. The exposed top and bottom portions of the die paddle 16 can be vertically aligned (i.e., the exposed top portion of the die paddle 16 being directly above the exposed bottom portion of the die paddle 16, as clearly shown in FIGS. 3A and 3B). Alternatively, the exposed portions of the die paddle 16 may be vertically offset. For example, as partially shown in FIG. 1, the die paddle 16 could have a top portion exposed at the top right portion of the die 18, while it could have a bottom portion (not shown) exposed to the bottom left portion of the die 18. In either case, such enlarged die paddles 16 should improve thermal management.

The inventors also discovered that heat dissipation is further improved by extending the die paddle 16 to two of the side surfaces 32 of the package 14, as shown in FIGS. 2, 3A, 3B, and 4B. The die paddle thus can be extended to two of the side surfaces 32 in this manner for packages having a dual package configuration; namely, a package having pads 34 (or leads 20) along two of the sides only. The die paddle 16 is not extended to the side surfaces 32 if the packages 14 are in a quad package configuration; namely, a package having pads 34 or leads 20 along all four sides.

Extending the leads 20 between the top and bottom surfaces 28 and 30 in a similar manner, however, is not necessary for the heat management purposes discussed above. Accordingly, some embodiments extend the leads 20 only to one surface or the other, depending upon the mounting surface.

Moreover, after further research, the inventors also discovered that a paddle 16 configured in the manner discussed above facilitates removal of a packaged microchip from a circuit board 12. Specifically, before shipping a product, system designers often run a battery of tests on the circuit components mounted on the printed circuit board 12. If a packaged microchip is defective, rather than discard the entire circuit board 12, system designers often prefer to just remove the defective packaged microchip. One common way of removing a leadless package involves positioning a dam around the package to form a chamber, and then injecting heat into the chamber. The dam maintains the heat around the package, which loosens the solder, thus enabling the designer to remove the package from the circuit board 12. In addition to being cumbersome, this process also requires extra real estate around the package to accommodate the dam—even if the dam is never used.

The inventors discovered that exposing the metal on the bottom surface 30 of the package to its top surface 28 eliminates the need for this cumbersome removal process. In other words, the leadframe metal soldered to the circuit board 12 extends from the bottom surface 30 to the top surface 28 for easy, direct access—that metal is thermally exposed for direct physical contact. Simply touching the exposed metal with a soldering iron (or other specially made hot tool) therefore should heat the solder on the bottom surface 30, thus softening it for package removal. Accordingly, this technique can both simplify removal of a package 14 from a circuit board 12 and eliminate the need to reserve real estate on the circuit board 12 for a dam.

To those ends, as shown in FIGS. 2, 3A, 3B, and 4A, illustrative embodiments also extend the leads 20 from the top surface 28 to the bottom surface 30. In fact, this embodiment further enables stacked package configurations.

To further manage heat, some embodiments also have a heat sink supported on the top surface 28 of the package 14. To that end, the heat sink thermally contacts the die paddle 16; preferably, directly contacting the die paddle 16. FIG. 5 schematically shows such an embodiment, with a heat sink 36 secured to the top surface 28 of the package 14. To avoid short-circuits across the leads 20, the heat sink 36 should contact the die paddle 16 only. The inventors discovered that various embodiments with enlarged die paddles 16 enhanced the benefits of the heat sink 36 by drawing heat away from the circuit board 12. Consequently, the circuit board 12 should remain cooler.

As noted above, various embodiments also apply to premolded leadframe packages. To that end, FIG. 5 also shows a premolded leadframe package 14 secured to a printed circuit board 12. In a manner similar to the postmolded packages 14 discussed above, this premolded package 14 also has an enlarged die paddle 16 extending between its top and bottom surfaces 28 and 30. In addition, this package 14 has a lid 38 that, together with the leadframe and encapsulating material (not shown), form an air-filled chamber 40 containing a die 18. As discussed above, one anticipated application of this design involves MEMS devices.

Alternative embodiments apply to leaded packages. Specifically, despite the fact that they generally require more real estate on a circuit board 12, leaded packages also may have die paddles 16 extending between their top and bottom surfaces 28 and 30. Accordingly, such package types can have both the heat management benefits of the leadless packages (enlarged die paddles 16) and still be easy to remove from the underlying circuit board 12.

Figure 6:
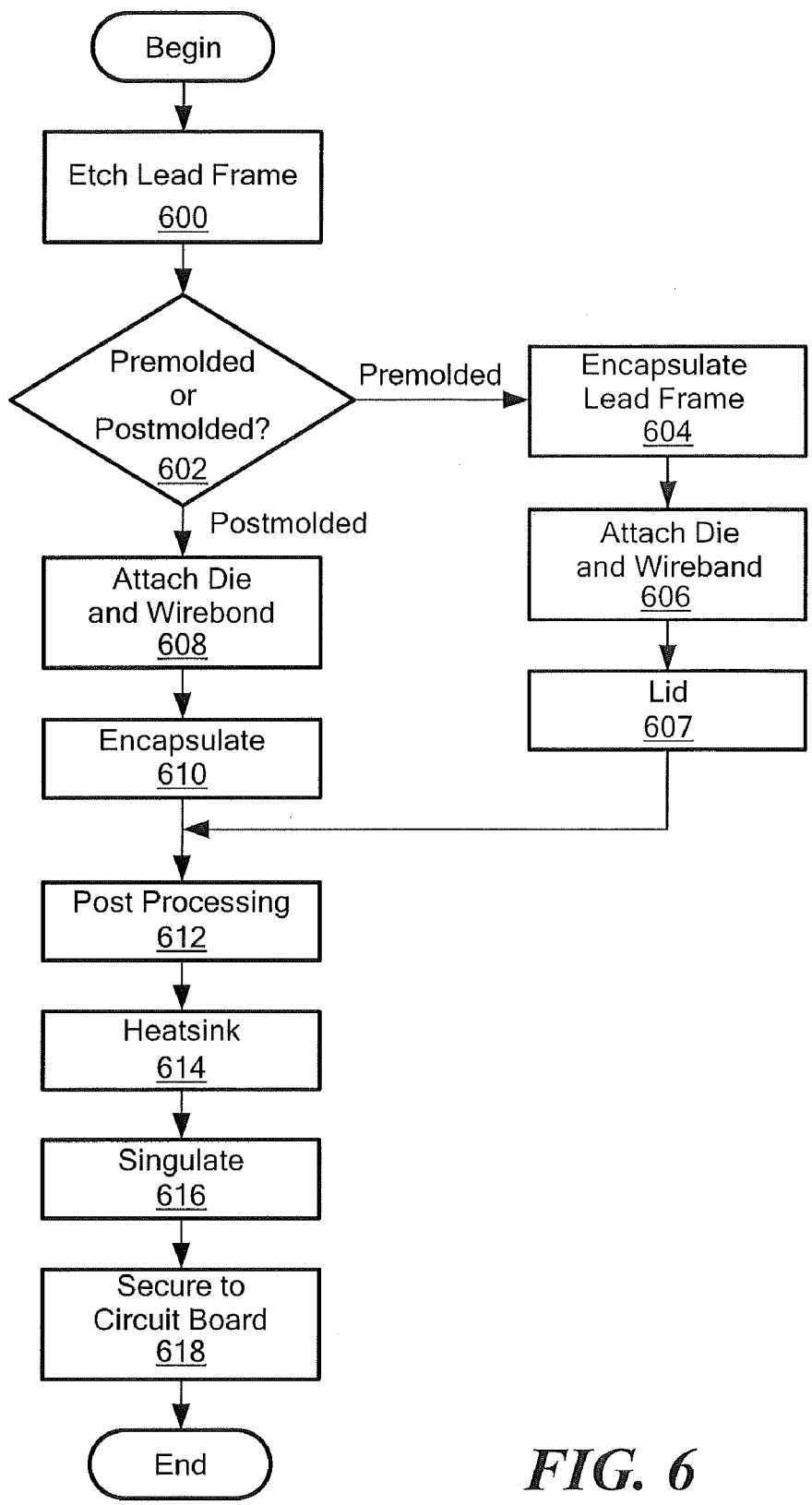
FIG. 6 shows a process of forming the packaged microchip system as shown in FIGS. 2-5.

FIG. 6 shows a process of forming a packaged microchip system 10 as collectively shown in FIGS. 1-5 in accordance with illustrative embodiments of the invention. It should be noted that this process is a summary of a much longer process and thus, may omit certain steps. In addition, this process may perform some of the steps in an order that is different than that discussed. For example, certain steps may be implemented substantially simultaneously, or in a different order than that discussed.

It should be noted that this process is discussed as being completed as a batch process. Accordingly, the process simultaneously forms multiple package systems. Those skilled in the art nevertheless can modify this process to fabricate a single package system only.

The process begins at step 600, which etches the leadframe. To that end, half etching processes (or other etching processes) may etch a flat sheet of copper or other conductive material into a two dimensional array of leadframes. As noted above, each of the leadframes has an enlarged die paddle 16, which in some embodiments, may extend to what will be the end of each package 14. In addition, etching processes form the die paddles 16 to extend between the top and bottom surfaces 28 and 30 of the ultimately formed packages 14.

In some embodiments, the extreme top and bottom surfaces of the die paddles 16 (i.e., the portions that will be part of the top surface 28 of the final package 14) simply are the same top and bottom surfaces of the original sheet of copper. There may be instances, however, where one or both of the top and bottom surfaces of the original sheet of copper have been removed, thus producing a generally thinner leadframe and paddle 16. In that case, the extreme top and bottom surfaces of the die paddle 16 still should form a part of the respective top or bottom surfaces 28 and 30 of the package 14.

The etching process also forms a plurality of leads 20 that ultimately will be spaced from the die paddle 16. Of course, in some embodiments, one of the leads 20 may remain in electrical contact with the die paddle 16, such as for grounding purposes. As noted above, various embodiments form dual package configurations—as shown in the figures. Accordingly, the leads 20 may be formed on two sides of the die paddle 16. The other two sides of the die paddle 16 may be enlarged and, as noted above, extend to what ultimately will be the ends of the package 14. The leads 20 also may extend from what will be the bottom and the top of the ultimately formed package 14.

The process then continues to step 602, which divides the process into forming either a premolded packaging process, or a postmolded packaging process. If forming a premolded package, the process continues to step 604, which encapsulates the leadframe with encapsulating material 24. Specifically, the process selects an appropriate encapsulating material 24 for the necessary application. For example, hermetic encapsulating materials may be used if a hermetic seal is required. In one embodiment, conventional thermoplastic molding material may encapsulate the leadframe.

To that end, the etched leadframe is inserted into a molding machine, which encapsulates selected portions of the leadframes in molding material 24. In illustrative embodiments, the molding material 24 encapsulates the leadframe to form a plurality of bodies 26 each having a bottom surface 30 and side surfaces 32. Each body 26 may be surface mountable and thus, have a plurality of surface mount pads 34 on its bottom surface 30—i.e., a leadless package. Alternatively, the molding material 24 may encapsulate each leadframe but have leads 20 extending from its body 26—i.e., a leaded package. In either case, the die paddle 16 extends from the bottom surface 30 to at least a height that ultimately will form the top surface 28 of the package 14. In a similar manner, the leads 20 also may be encapsulated so that they will extend between the top and bottom surfaces 28 and 30 of the soon to be formed packages 14.

After the molding material 24 cures, the process has, at this point, an array of premolded leadframe package bases that each can accept a die 18. The process thus continues to step 606, which attaches a die 18 to each die paddle 16 in a conventional manner, and then connects wirebonds 22 from each die 18 to at least some of its corresponding leads 20. Accordingly, each die paddle 16 supports the die 18, while the corresponding wirebonds 22/leads 20 can electrically connect the die 18 with an underlying, external system, such as a printed circuit board 12.

At this point in the process, each premolded package 14 has a die 18 secured to its base. Some implementations may secure a lid 38 over the premolded package base to form an internal chamber 40 containing the die 18 (step 607). The lid 38 may have walls that secure directly to the base, thus forming the chamber 40 containing the die 18. Alternatively, the package base may have plastic walls and the lid 38 may be flat and supported by those walls, and/or part of the die paddle 16. In either case, the die paddle 16 should at least be exposed to the top surface 28 of the package 14.

Some embodiments may forego the lid 38, although many applications using a premolded package are likely to require one. For example, a die 18 implementing a MEMS device (e.g., an inertial sensor, microphone, pressure sensor, switch, or other or other device) without a cap or other protection for the fragile microstructure may require a lid 38.

Returning to step 602, if the process forms a postmolded package, then the process continues to step 608, which, as with the premolded package 14, attaches a die 18 to each die paddle 16 in a conventional manner, and then connects wirebonds 22 from each die 18 to at least some of their corresponding leads 20. Accordingly, as with the premolded package 14, each die paddle 16 supports the die 18, while the wirebonds 22 and leads 20 can electrically connect each respective die 18 with an underlying, external system, such as a printed circuit board 12.

The process then continues to step 610, which encapsulates the die 18 and leadframes to form an array of generally rectangular bodies 26. Specifically, in a manner similar to many other integrated circuit packages, the body 26 has a top surface 28, a bottom surface 30, and four side surfaces 32. In a manner similar to that discussed above for the premolded package 14, the leads 20 are encapsulated so that the body 26 has a plurality of pads 34 on one or both of its top and bottom surfaces 28 and 30. Alternatively, a plurality of leads 20 may extend from the body 26. In either case, the top and bottom surfaces 28 and 30 also include exposed portions of the enlarged die paddle 16.

The process optionally may perform some post-processing steps (step 612), and then optionally secure a heat sink 36 to the top of the body 26 or lid 38, whichever the case may be), step 614. As noted above, the heat sink 36 should be in both thermal and physical contact with the top surface 28 of the die paddle 16. Among other benefits, the heat sink 36 draws heat away from the printed circuit board 12. The heat sink may be added by any party, such as an end user or as part of the overall packaging process.

Next, the process may singulate the packages 14 into individual packaged microchips (step 616), and then secure each packaged microchip to an underlying device, such as a printed circuit board 12 (step 618).

Accordingly, illustrative embodiments have a larger die paddle 16 and, in some embodiments, within a smaller package. Additional heat dissipation devices (e.g., heat sinks or fans) thus are not as necessary, although head sinks can add further benefits in high temperature applications.

In addition, defective chips can be more easily removed now that the die paddle 16 and leads 20 are accessible to a heat tool, such as a soldering iron. It is contemplated that a special tool having a plurality of arms corresponding with the exposed top-side metal can provide an efficient means for rapidly removing the leadframe portions on the bottom side of the package 14. No additional circuit board real estate thus must be reserved for a dam or other heat containing apparatus.

Although the above discussion discloses various exemplary embodiments of the invention, it should be apparent that those skilled in the art can make various modifications that will achieve some of the advantages of the invention without departing from the true scope of the invention.

What is claimed is:

1. An integrated circuit package system comprising:
   a body having a top surface, a bottom surface, and a plurality of side surfaces;
   a leadframe having a die paddle for supporting a die, the leadframe also having a plurality of leads spaced from the die paddle; and
   encapsulating material encapsulating at least a portion of the leadframe and separating the die paddle from the plurality of leads, the body comprising the leadframe and the encapsulating material,
   at least a first portion of the die paddle exposed to the top surface,
   at least a second portion of the die paddle exposed to the bottom surface.

2. The integrated circuit package system as defined by claim 1 wherein the package system has a package thickness between the top surface on the bottom surface, the first portion and second portion being contiguous and together having a thickness equal to about the package thickness, the first and second portions together extending between the bottom surface and the top surface.

3. The integrated circuit package system as defined by claim 1 wherein the die paddle extends to at least two of the side surfaces.

4. The integrated circuit package system as defined by claim 1 wherein the plurality of leads each extend between the top surface and the bottom surface.

5. The integrated circuit package system as defined by claim 1 wherein the plurality of leads are arranged in an array generally parallel with two of the surfaces to form a dual package configuration.

6. The integrated circuit package system as defined by claim 1 further comprising a heat sink supported by and in thermal contact with the die paddle along the top surface.

7. The integrated circuit package system as defined by claim 1 wherein the leads and mold material form a plurality of surface mount pads on the bottom surface.

8. The integrated circuit package system as defined by claim 1 further comprising a die secured to the die paddle and a plurality of connectors electrically connecting the die to at least some of the plurality of leads.

9. The integrated circuit package system as defined by claim 1 wherein the leadframe and encapsulating material form a premolded leadframe package having a chamber for receiving a die, the system further comprising a lid generally closing the chamber.

10. The integrated circuit package system as defined by claim 8 further comprising a printed circuit board, the die paddle and leads being surface mounted to the printed circuit board.

11. An integrated circuit package comprising:
    a top surface, a bottom surface, and a plurality of side surfaces;
    a leadframe having a die paddle for supporting a die, the leadframe also having a plurality of leads spaced from the die paddle; and
    encapsulating material encapsulating at least a portion of the leadframe and a portion of the plurality of leads, the encapsulating material and leads forming a plurality of surface mount pads on the bottom surface, at least a portion of the die paddle exposed to both the top and bottom surfaces.

12. The integrated circuit package as defined by claim 11 wherein the leads are aligned along two side surfaces to form a dual package configuration.

13. The integrated circuit package as defined by claim 11 wherein the die paddle extends to at least two of the side surfaces.

14. The integrated circuit package system as defined by claim 11 wherein the plurality of leads each extend between the top surface and the bottom surface.

15. The integrated circuit package system as defined by claim 11 further comprising a heat sink supported by and in thermal contact with the die paddle along the top surface.

* * * * *